(12) United States Patent
Fukushima et al.

(10) Patent No.: US 6,492,702 B2
(45) Date of Patent: Dec. 10, 2002

(54) CIRCUIT-INCORPORATING LIGHT RECEIVING DEVICE

(75) Inventors: Toshihiko Fukushima, Nara (JP); Masaru Kubo, Kitakatsuragi (JP); Shigeki Hayashida, Kitakatsuragi (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/820,341

(22) Filed: Mar. 29, 2001

(65) Prior Publication Data

US 2001/0038096 A1 Nov. 8, 2001

(30) Foreign Application Priority Data

Mar. 29, 2000 (JP) .......................... 2000-090493

(51) Int. Cl.[7] ....................... H01L 31/075; H01L 31/105
(52) U.S. Cl. .................. 257/458; 257/292; 257/446
(58) Field of Search ................... 257/292, 458, 257/446

(56) References Cited

U.S. PATENT DOCUMENTS 4,910,570 A * 3/1990 Popovic ..................... 257/446
5,418,396 A * 5/1995 Mita ........................... 257/446

FOREIGN PATENT DOCUMENTS

| JP | 6-13643 A | 1/1994 |
|---|---|---|
| JP | 9-307086 A | 11/1997 |
| JP | 2793085 B2 | 6/1998 |

* cited by examiner

Primary Examiner—Jerome Jackson
(74) Attorney, Agent, or Firm—Nixon & Vanderhye P.C.

(57) ABSTRACT

A circuit-incorporating light receiving device comprises a first semiconductor substrate of a first conductivity type, a first semiconductor layer of the first conductivity type, a second semiconductor layer of the first conductivity type, a diffusion region of the second conductivity type, provided in a first portion of the second semiconductor layer of the first conductivity type, a circuit element provided in the first portion of the first semiconductor layer of the first conductivity type and a second portion of the second semiconductor layer of the first conductivity type. The second semiconductor layer of the first conductivity type and the diffusion region of the second conductivity type form a light detection photodiode portion, and the diffusion region of the second conductivity type has a diffusion depth less than or equal to a penetration depth of short-wavelength signal light.

35 Claims, 15 Drawing Sheets

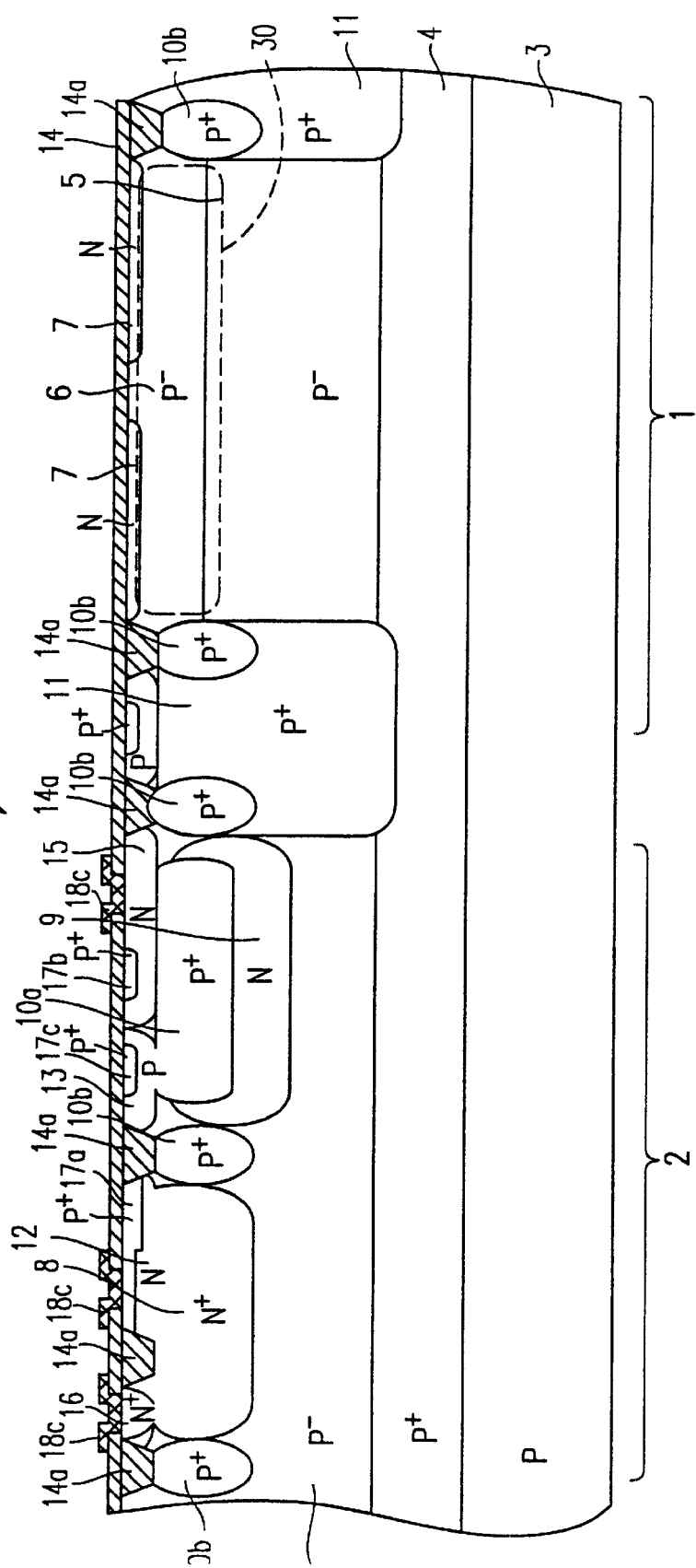

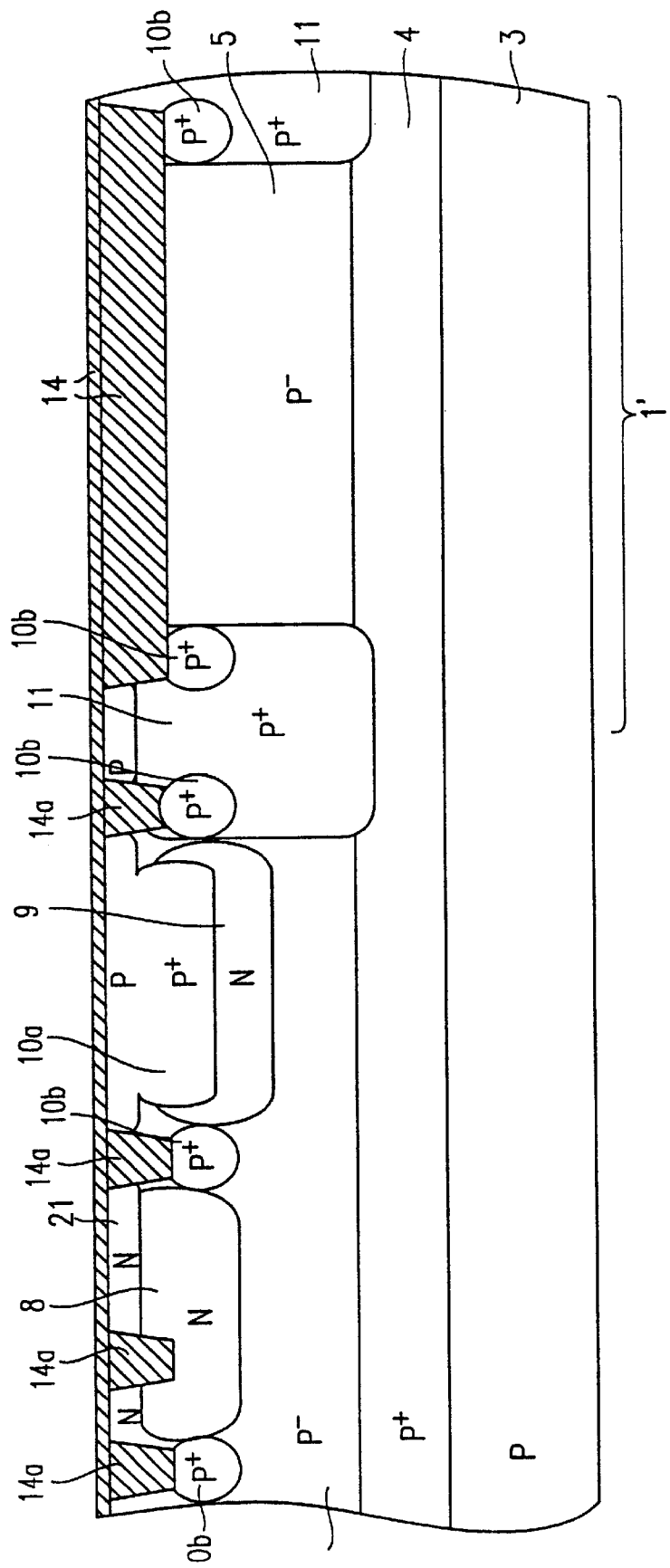

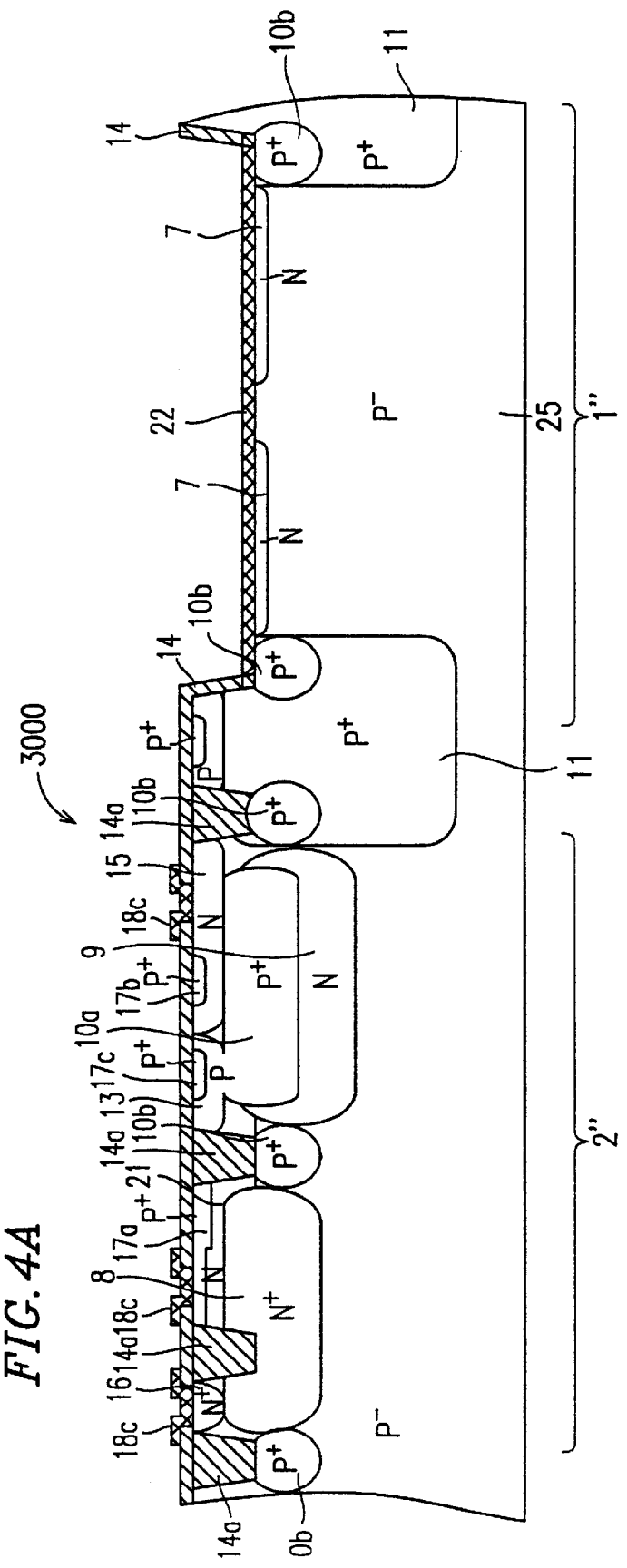

CIRCUIT-INCORPORATING LIGHT RECEIVING DEVICE

BACKGROUND OF THE INVENTION

1. Field of the Invention

The present invention relates to a circuit-incorporating light receiving device including a light detection photodiode portion and a circuit element on the same substrate. More particularly, the present invention relates to a structure of the circuit-incorporating light receiving device for improving a performance of the light detection photodiode portion.

2. Description of the Related Art

Recently, optical disk apparatuses are becoming smaller and smaller while the performance thereof is becoming higher and higher. With such advances, there is an increasing need for a compact and lightweight optical pickup. To achieve such an optical pickup, a technology has been proposed in which: a function for generating a tracking beam, a function for branching light, and a function for generating an error signal are integrated onto a single hologram device; a laser diode, a split photodiode, and the like are accommodated in a single package; or the hologram device is provided on an upper surfaces of the package. Such a technology is called an optical module.

Among components included in an optical pickup apparatus is a circuit-incorporating light receiving device. In the circuit-incorporating light receiving device, circuit elements, such as a light detection photodiode portion for converting signal light to an electric signal (optoelectric transduced signal), a transistor for processing the optoelectric transduced signal, a resistor, and a capacitor, are integrated.

FIG. 5 is a cross-sectional view showing a structure of a conventional circuit-incorporating light receiving device 4000.

The circuit-incorporating light receiving device 4000 includes a photodiode region 51 in which a light detection photodiode portion which converts signal light to an electric signal is provided, and a peripheral circuit region 52 which is used to process the optoelectric transduced signal. Specifically, in the peripheral circuit region 52, an NPN transistor and a vertical PNP transistor are provided.

To reduce cost in fabrication of the circuit-incorporating light receiving device 4000, the commonality of fabrication processes is increased. For both the photodiode region 51 and the peripheral circuit region 52, a P-type substrate 53 (P), a P-type epitaxial layer 54 (P⁻), and an N-type epitaxial layer 55 (N) are successively provided in this order. In the photodiode region 51, the P-type epitaxial layer 54 and the N-type epitaxial layer 55, which have PN junction, form a light detection photodiode portion. In the peripheral circuit region 52, the above-described two transistors are provided in the P-type epitaxial layer 54 and the N-type epitaxial layer 55 due to impurity diffusion.

The photosensitivity and response speed of a photodiode are generally key measures of the performance of the photodiode. The photosensitivity is determined by the sum of the number of carriers generated in a depletion layer and the number of carriers which are generated outside the depletion layer and which reach the depletion layer due to carrier diffusion when reverse bias is applied to the PN junction in light detection. The response speed is influenced to a large extent by the value of a PN junction capacitance of the light detection photodiode portion. Therefore, to enlarge the depletion layer sufficiently is effective to increase the sensitivity of the photodiode and reduce the junction capacitance to increase the response speed.

Therefore, as a first conductivity type region, the P-type substrate 53, on a surface of which the P-type epitaxial layer 54 having a low concentration (high specific resistance) is provided, is used as described above. Alternatively, a P-type low-concentration substrate (not shown) may be used instead.

Such a structure causes a depletion layer to be easily expanded in the first conductivity type region in which light is absorbed, thereby making it possible to efficiently utilize penetrating signal light. Further, the PN junction capacitance can be reduced.

As the recording density of an optical recording medium, such as an optical disk, becomes higher and higher year after year, the wavelength of light applied to the medium is decreased. Specifically, whereas infra-red light having a wavelength of 780 nm is used for CDs, red light having a reduced wavelength of 650 nm is used for DVDs. The use of blue light having a further reduced wavelength of about 410 nm is being developed.

However, as the wavelength of signal light is reduced, the depth of silicon to which the signal light can reach (hereinafter referred to as a penetration depth) is rapidly decreased. For example, although the penetration depth of 780-nm light is as long as about 8 $\mu$m, the penetration depth of 410-nm light is less than or equal to about 0.3 $\mu$m.

There are the following problems with the structure of the photodiode region in the conventional circuit-incorporating light receiving device 4000 of FIG. 5.

(1) The N-type epitaxial layer 55 typically needs to have a thickness of at least about 1 $\mu$m or more in order to provide a transistor in the peripheral circuit region 52. Further, an N-type diffusion region 56 (N⁺) having a high concentration is provided in order to reduce a cathode resistance, sot hat penetrating light is mostly absorbed by the N-type epitaxial layer 55 which has substantially no depletion. Therefore, the recombination rate of carriers is high and the recombined carriers cannot contribute to an optoelectric current, so that the sensitivity cannot be enhanced. Further, the PN junction capacitance of the light detection photodiode portion is too large to achieve a high response speed.

(2) The N-type epitaxial layer 55 could be caused to be thin, not taking into account the conformity with the peripheral circuit region 52. In this case, when the N-type epitaxial layer 55 is grown, P-type auto dope occurs due to a peripheral isolation diffusion region 57 (P⁺) or a film production apparatus. The occurrence of auto dope leads to formation of a potential peak in the vicinity of an interface between the first conductive region (the P-type substrate 53 having the low-concentration P-type epitaxial layer 54 grown thereon, or the P-type low-concentration substrate) and the N-type epitaxial layer 55 grown thereon, which deteriorates a response characteristic.

(3) To reduce the fabrication steps and improve the sensitivity to short-wavelength light, a light detection photodiode portion in which a P-type diffusion region is provided in the N-type epitaxial layer 55 may be provided. However, in this case, boron used in the P-type diffusion region is segregated on a surface thereof, so that Ns (surface concentration) is lowered. As a result, the surface recombination is increased, so that the sensitivity is lowered. Further, the photosensitivity of the light detection photodiode cannot be increased for long-wavelength light having a large penetration depth due to the structure thereof. Since the depletion layer is not so enlarged, the junction capacitance is increased and therefore the response speed is lowered.

(4) In the conventional structure of FIG. 5 in which the light detection photodiode portion is separated by the isolation diffusion region 57 in which diffusion is carried out upward and downward, it is assumed that light is incident to the isolation diffusion region 57. As shown in FIGS. 6A and 6B, the impurity concentration distribution of the isolation diffusion region 57 has a profile taken along a line A—A' of FIG. 5 and a profile taken along a line B—B' of FIG. 5, respectively. Generated carriers are accumulated in a valley in FIG. 6A. Referring to FIG. 6B, since the middle portion has substantially no tilt, the accumulated carriers laterally move at a low speed. Therefore, the response speed cannot be improved.

According to the above-described reasons, a plurality of circuit-incorporating light receiving devices corresponding to respective wavelength regions are required in a recording and reproduction apparatus in order to be compatible with optical recording media using signal light having different wavelengths, such as a short wavelength and a long wavelength. This leads to a complex system.

SUMMARY OF THE INVENTION

According to one aspect of the present invention, a circuit-incorporating light receiving device comprises a first semiconductor substrate of a first conductivity type, a first semiconductor layer of the first conductivity type, a second semiconductor layer of the first conductivity type, a diffusion region of the second conductive type, provided in a first portion of the second semiconductor layer of the first conductivity type, a circuit element provided in the first portion of the first semiconductor layer of the first conductivity type and a second portion of the second semiconductor layer of the first conductivity type. The second semiconductor layer of the first conductivity type and the diffusion region of the second conductivity type form a light detection photodiode portion, and the diffusion region of the second conductivity type has a diffusion depth less than or equal to a penetration depth of short-wavelength signal light.

In one embodiment of this invention, the diffusion depth of the diffusion region of the second conductivity type is less than or equal to 0.3 $\mu$m.

In one embodiment of this invention, the short-wavelength signal light is blue light.

Therefore, the thickness of the first and second semiconductor layers in which the circuit element is provided can be sufficient, and PN junction can be provided at a shallow position in a surface of a photodiode region in the second semiconductor layer. Even short-wavelength signal light can be sufficiently absorbed. This leads to an achievement of a circuit-incorporating light receiving device having a high-sensitivity light detection photodiode portion.

In addition, when the concentrations of both first and second semiconductor layers are set to low values, the depletion layer in the light detection photodiode portion sufficiently expands toward a substrate side as does in a conventional case. This leads to an achievement of a circuit-incorporating light receiving device having a high-sensitivity light detection photodiode portion. These performances are not lowered in the case of long-wavelength signal light.

This is particularly effective when silicon is used as a semiconductor material included in the photodiode region.

In one embodiment of this invention, a surface impurity concentration of the first semiconductor layer of the first conductivity type is greater than or equal to $1 \times 10^{14}$ cm$^{-3}$.

Therefore, an anti-auto dope ability can be enhanced. Undesired auto dope concentration is about $1 \times 10^{14}$ cm$^{-3}$ at most. In the case of the above-described surface concentration, the auto dope does not substantially influence on a variation in a characteristic of the light detection photodiode.

In one embodiment of this invention, the first semiconductor layer of the first conductivity type and the second semiconductor layer of the first conductivity type have impurity concentrations such that when reverse bias is applied to the light detection photodiode portion upon detection of the signal light, a depletion layer expanding from an interface between the second semiconductor layer of the first conductivity type and the diffusion region of the second conductivity type toward the second semiconductor layer of the first conductivity type side, reaches a position deeper than an interface between the first semiconductor layer of the first conductivity type and the second semiconductor layer of the first conductivity type.

This makes it possible to remove an influence of a potential peak at the interface between the first and second semiconductor layers due to the auto dope in the fabrication steps.

In one embodiment of this invention, a high-concentration buried layer of the first conductivity type is provided between the first semiconductor substrate of the first conductivity type and the first semiconductor layer of the first conductivity type, wherein an impurity concentration of the high-concentration buried layer is greater than an impurity concentration of the first semiconductor layer of the first conductivity type.

Therefore, an anode resistance in a traverse direction up to an electrode is reduced. Further, a potential barrier is produced against carriers generated deeper than the buried layer when long-wavelength signal light enters the device. In this case, the carriers are prevented from contributing to a photoelectric current, thereby making it possible to prevent a reduction in a response speed due to a diffusion current.

In one embodiment of this invention, the high-concentration buried layer of the first conductivity type is provided by a buried diffusion method or an epitaxial growth method.

In the case of the buried diffusion method, the circuit-incorporating light receiving device can be easily obtained. In the case of the epitaxial growth method, a concentration profile thereof can be controlled with great precision.

In one embodiment of this invention, the first portion of the first semiconductor layer of the first conductivity type and the second portion of the second semiconductor layer of the first conductivity type have an N-type well region and a P-type well region, and the circuit element is provided using the N-type well region and the P-type well region.

Conditions, such as the conductivity type and concentration of an epitaxial growth layer on which a circuit element, such as a transistor, is provided, can be freely designed for a photodiode.

In one embodiment of this invention, an isolation diffusion region of the first conductivity type is provided between the light detection photodiode portion and the circuit element, wherein an impurity concentration of the isolation diffusion region is greater than an impurity concentration of the first semiconductor layer of the first conductivity type, and the isolation diffusion region of the first conductivity type reaches a position deeper than the light detection photodiode portion and the circuit element.

An anode resistance in a depth direction up to an electrode contact can be reduced, thereby reducing a CR time constant and achieving a high-speed response characteristic.

In one embodiment of this invention, an impurity concentration of each of the first semiconductor layer of the first conductivity type and the second semiconductor layer of the first conductivity type is greater than or equal to $1 \times 10^{14}$ cm$^{-3}$.

A circuit-incorporating light receiving device can be achieved which has a light detection photodiode portion which can absorb any light from long-wavelength to short-wavelength, and a high sensitivity and a high-speed response over a range from long-wavelength to short-wavelength.

In one embodiment of this invention, the diffusion region of the second conductivity type is divided into a plurality of regions by the second semiconductor layer of the first conductivity type.

Since an isolation structure obtained by an upward and downward high-concentration diffusion method is not used, substantially no high-concentration isolation diffusion region does not exist. Therefore, substantially no depletion layer occurs in the plurality of regions, and carriers generated immediately under the plurality of regions reach the depletion layer without going around the isolation diffusion region. Thereby, a circuit-incorporating light receiving device having a divided light detection photodiode portion having an improved response speed can be achieved.

In one embodiment of this invention, the diffusion region of the second conductivity type is divided into a plurality of regions by a groove.

A parasitic capacitance of a side can be reduced to more extent than when the light detection photodiode is divided by an upward and downward high-concentration diffusion method using an isolation diffusion region. Thereby, a circuit-incorporating light receiving device having a divided light detection photodiode portion having an improved CR time constant can be achieved.

In one embodiment of this invention, the groove is provided by a LOCOS method.

Since a semiconductor layer is removed by the LOCOS method, a highly-reliable photodiode can be obtained. Although a trench method may be used to fabricate the structure of the present invention, an increase in a junction leak due to dry etching leads to deterioration of a photodiode characteristic. A circuit-incorporating light receiving device having a more reliable light detection photodiode portion can be achieved when the groove is produced by the LOCOS method.

According to another aspect of the present invention, a circuit-incorporating light receiving device comprises a first semiconductor substrate of a first conductivity type, a first semiconductor layer of the first conductivity type, a second semiconductor layer of the first conductivity type, a first groove reaching the first semiconductor layer of the first conductivity type being provided in the second semiconductor layer, a diffusion region of a second conductivity type provided in a first portion of the first semiconductor layer of the first conductivity type, the first portion being exposed at a bottom side of the first groove, and a circuit element provided in a second portion of the first semiconductor layer of the first conductivity type and a first portion of the second semiconductor layer of the first conductivity type. The first semiconductor layer of the first conductivity type and the diffusion region of the second conductivity type form a light detection photodiode portion. The diffusion region of the second conductivity type has a diffusion depth less than or equal to a penetration depth of short-wavelength signal light.

Therefore, conditions, such as the conductivity type, concentration, thickness, and the like of the second semiconductor layer, and be freely determined independently of the light detection photodiode portion. Conditions required for the circuit element can be designed. PN junction can be provided at a shallow position in the surface of the photodiode region in the first semiconductor layer, and even short-wavelength signal light can be sufficiently absorbed in the depletion layer. Thereby, a circuit-incorporating light receiving device which has a circuit element having an optimized characteristic and a high-sensitivity light detection photodiode can be achieved.

Since the depth of the groove reaches a region deeper than the interface between the first semiconductor layer and second semiconductor layer, an auto dope layer generated in the vicinity of the interface can be removed. Further, when the concentration of the first semiconductor layer is set to be a low value, the depletion layer in the light detection photodiode portion sufficiently expands toward a substrate side as does in a conventional case. This leads to an achievement of a high-speed light detection photodiode portion. These performances are not lowered in the case of long-wavelength signal light.

In one embodiment of this invention, the diffusion depth of the diffusion region of the second conductivity type is less than or equal to 0.3 μm.

In one embodiment of this invention, the short-wavelength signal light is blue light.

In one embodiment of this invention, a high-concentration buried layer of the first conductivity type is provided between the first semiconductor substrate of the first conductivity type and the first semiconductor layer of the first conductivity type, wherein an impurity concentration of the high-concentration buried layer is greater than an impurity concentration of the first semiconductor layer of the first conductivity type.

In one embodiment of this invention, the high-concentration buried layer of the first conductivity type is provided by a buried diffusion method or an epitaxial growth method.

In one embodiment of this invention, the second portion of the first semiconductor layer of the first conductivity type an the first portion of the second semiconductor layer of the first conductivity type have an N-type well region and a P-type well region, and the circuit element is provided using the N-type well region and the P-type well region.

In one embodiment of this invention, an isolation diffusion region of the first conductivity type is provided between the light detection photodiode portion and the circuit element, wherein an impurity concentration of the isolation diffusion region is greater than an impurity concentration of the first semiconductor layer of the first conductivity type, and the isolation diffusion region reaches a position deeper than the light detection photodiode portion and the circuit element.

In one embodiment of this invention, an impurity concentration of the first semiconductor layer of the first conductivity type is greater than or equal to $1 \times 10^{14}$ cm$^{-3}$.

In one embodiment of this invention, the diffusion region of the second conductivity type is divided into a plurality of regions by the first semiconductor layer of the first conductivity type.

In one embodiment of this invention, the diffusion region of the second conductivity type is divided into a plurality of regions by a second groove.

In one embodiment of this invention, the first groove is provided by a LOCOS method.

According to another aspect of the present invention, a circuit-incorporating light receiving device comprises a first semiconductor substrate of a first conductivity type, a first semiconductor layer of the first conductivity type, a first groover reaching the first semiconductor substrate of the first conductivity type being provided in the first semiconductor layer, a diffusion region of a second conductivity type, provided in a first portion of the first semiconductor substrate of the first conductivity type, the first portion being exposed at a bottom side of the first groove, and a circuit element provided in a second portion of the first semiconductor substrate of the first conductivity type and the first portion of the first semiconductor layer of the first conductivity type. The first semiconductor substrate of the first conductivity type and the diffusion region of the second conductivity type form a light detection photodiode portion. The diffusion region of the second conductivity type has a diffusion depth less than or equal to a penetration depth of short-wavelength signal light.

Therefore, a low-concentration (high-specific-resistance) epitaxial growth layer which is difficult to control is not used whereas a low-concentration substrate which is relatively easy to produce is used. A circuit-incorporating light receiving device having a circuit element having an optimized characteristic, and a light detection photodiode having a high sensitivity and a high-speed response over a range from long-wavelength to short-wavelength can be achieved.

In one embodiment of this invention, the diffusion depth of the diffusion region of the second conductivity type is less than or equal to 0.3 μm.

In one embodiment of this invention, the short-wavelength signal light is blue light.

In one embodiment of this invention, a second semiconductor substrate of the first conductivity type is provided at the bottom side of the first semiconductor substrate of the first conductivity type, wherein a high-concentration buried layer of the first conductivity type having an impurity concentration greater than an impurity concentration of the first semiconductor substrate of the first conductivity type is provided in the second semiconductor substrate of the first conductivity type.

Therefore, an anode resistance in a traverse direction up to an electrode is reduced in the high-concentration buried layer. Further, a potential barrier is produced against carriers generated deeper than the buried layer when long-wavelength signal light enters the device. In this case, the carriers are prevented from contributing to a photoelectric current, thereby making it possible to prevent a reduction in a response speed due to a diffusion current. Furthermore, the substrates attached to each other is used whereas a low-concentration epitaxial growth layer which is difficult to control is used, and a low-concentration region can be provided on the high-concentration buried layer.

In one embodiment of this invention, a second semiconductor substrate of the first conductivity type is provided at the bottom side of the first semiconductor substrate of the first conductivity type, wherein the second semiconductor substrate of the first conductivity type has an impurity concentration greater than an impurity concentration of the first semiconductor substrate of the first conductivity type.

Therefore, an anode resistance in a traverse direction up to an electrode is reduced in the high-concentration buried layer. Further, a potential barrier is produced against carriers generated deeper than the buried layer when long-wavelength signal light enters the device. In this case, the carriers are prevented from contributing to a photoelectric current, thereby making it possible to prevent a reduction in a response speed due to a diffusion current. Furthermore, the substrates attached to each other is used whereas a low-concentration epitaxial growth layer which is difficult to control is used, and a low-concentration region can be provided on the high-concentration buried layer.

In one embodiment of this invention, the second portion of the first semiconductor substrate of the first conductivity type and the first portion of the first semiconductor layer of the first conductivity type have an N-type well region and a P-type well region, and the circuit element is provided using the N-type well region and the P-type well region.

In one embodiment of this invention, an isolation diffusion region of the first conductivity type is provided between the light detection photodiode portion and the circuit element, wherein an impurity concentration of the isolation diffusion region is greater than an impurity concentration of the first semiconductor substrate of the first conductivity type, and the isolation diffusion region reaches a position deeper than the light detection photodiode portion and the circuit element.

In one embodiment of this invention, an impurity concentration of the first semiconductor substrate of the first conductivity type is greater than or equal to $1 \times 10^{14}$ cm$^{-3}$.

In one embodiment of this invention, the diffusion region of the second conductivity type is divided into a plurality of regions by the first semiconductor substrate of the first conductivity type.

In one embodiment of this invention, the diffusion region of the second conductivity type is divided into a plurality of regions by a second groove.

In one embodiment of this invention, the first groove is provided by a LOCOS method.

Thus, the invention described herein makes possible the advantages of providing a circuit-incorporating light receiving device which can read from short- to long-wavelength signal light which is used for a CD, a DVD, or a blue-light DVD, and which can be easily produced by integrating circuit elements, such as a transistor, on the same substrate.

These and other advantages of the present invention will become apparent to those skilled in the art upon reading and understanding the following detailed description with reference to the accompanying figures.

BRIEF DESCRIPTION OF THE DRAWINGS

FIGS. 1A and 1B are cross-sectional views showing a circuit-incorporating light receiving device according to Example 1 of the present invention.

FIGS. 3A, 3B and 3C are cross-sectional views showing an exemplary method for fabricating a circuit-incorporating light receiving device according to Example 2 of the present invention.

FIGS. 4A, 4B and 4C are cross-sectional views showing a circuit-incorporating light receiving device according to Example 3 of the present invention.

DESCRIPTION OF THE PREFERRED EMBODIMENTS

Figure 1B:
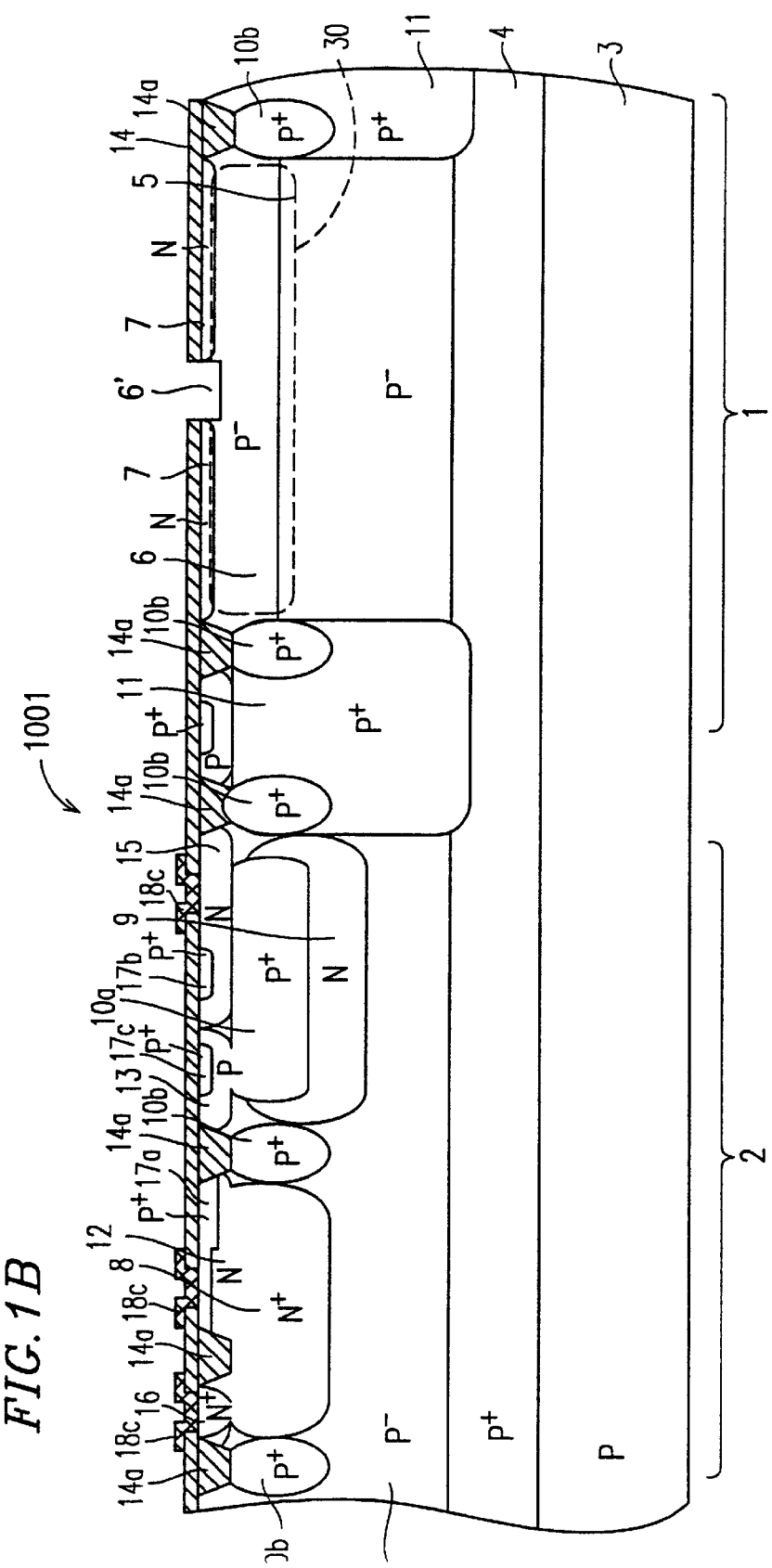

Hereinafter, the present invention will be described by way of illustrative examples with reference to the accompanying drawings. The conductivity type and concentration of each portion are indicated by ( ) described immediately after the portion.

EXAMPLE 1

FIG. 1A is a cross-sectional view showing a circuit-incorporating light receiving device 1000 according to Example 1 of the present invention.

The circuit-incorporating light receiving device 1000 includes a photodiode region 1 in which a light detection photodiode portion which converts a signal light to an electric signal (optoelectric transduced signal) is provided, and a peripheral circuit region 2 in which a circuit element used to process the optoelectric transduced signal is provided. Specifically, in the peripheral circuit region 2, an NPN transistor and a vertical PNP transistor are provided.

In the photodiode region 1, a P-type silicon substrate 3 (P), a P-type high-concentration buried layer 4 (P$^+$), a first P-type epitaxial layer 5 (P$^-$), and a second P-type epitaxial layer 6 (P$^-$) are successively provided in this order. A thin first N-type diffusion region 7 (N) is provided within a surface of the second P-type epitaxial layer 6. The second P-type epitaxial layer 6 and the first N-type diffusion region 7, which has PN junction, form a light detection photodiode portion.

In the peripheral circuit region 2, a P-type silicon substrate 3 (P), a P-type high-concentration layer 4 (P$^+$), a first P-type epitaxial layer 5 (P$^-$), and a second P-type epitaxial layer 6 (P$^-$) are successively provided in this order. These fabrication steps may be carried out simultaneously with the fabrication steps for the photodiode region 1. The NPN transistor and the vertical PNP transistor are formed by regions (described later) of the first and second P-type epitaxial layers 5 and 6.

The first N-type diffusion region 7 has a diffusion depth corresponding to a penetration depth to semiconductor of blue signal light having a wavelength (short-wavelength) of about 410 nm, which is used for a DVD or the like. Specifically, the penetration depth of the blue signal light to silicon is about 0.3 $\mu$m or less as described above, so that the diffusion depth is set to about 0.3 $\mu$m or less.

Therefore, a position of a depletion layer 30, which expands from an interface between the second P-type epitaxial layer 6 and the first N-type diffusion region 7 due to reverse bias applied to the light detection photodiode portion, corresponds to the penetration depth of the blue signal light. As a result, carriers can be generated within the depletion layer, thereby improving the photosensitivity of the photodiode to short-wavelength light and the response speed thereof. Further, that the diffusion depth of the first N-type diffusion region 7 is set to about 0.3 $\mu$m or less is effective to a semiconductor material included in the photodiode region 1, and is particularly effective when the material is silicon.

Further, the first and second P-type epitaxial layers 5 and 6 have impurity concentrations such that the position of the depletion layer 30, which expands from an interface between the second P-type epitaxial layer 6 and the first N-type diffusion region 7 due to reverse bias applied to the light detection photodiode portion, corresponds to the penetration depth of infra-red signal light of about 780 nm which is used for a CD or the like. As a result, carriers can be generated within the depletion layer even for long-wavelength light, thereby improving the photosensitivity of the photodiode (the light detection photodiode section) to long-wavelength light and the response speed thereof. Further, when the first and second P-type epitaxial layers 5 and 6 have impurity concentrations such that the position of the depletion layer 30 which reaches deeper than an interface between the first P-type epitaxial layer 5 and the second P-type epitaxial layer 6, the influence of the potential peak at the interface between the layers 5 and 6 due to auto dope in the fabrication process can be removed.

Further, when a plurality of the first N-type diffusion regions 7 are provided within the second P-type epitaxial layer 6, the photodiode region 1 is divided into a plurality of light receiving regions where the second P-type epitaxial layer 6 is interposed between each light receiving region. In this structure, the conventional isolation region provided by the upward and downward high-concentration diffusion method is not used, so that substantially no high-concentration isolation diffusion region is provided. As a result, substantially all of the plurality of light receiving regions in the second P-type epitaxial layer 6 can be caused to have depletion. Therefore, carriers occurring immediately under the light receiving regions can reach the depletion layer 30 without going around the photodiode region 1, thereby improving the response speed.

Instead of the above-described structure, in the circuit-incorporating light receiving device 1001 shown in FIG. 1B, a single first N-type diffusion region 7 can be divided by a groove 6' which reaches the second P-type epitaxial layer 6. In this case, a parasitic capacitance at a side of the light receiving region can be reduced more than when the upward and downward high-concentration diffusion method using the isolation diffusion structure is used, thereby improving the CR time constant.

FIGS. 2A, 2B, 2C, 2D and 2E are cross-sectional views showing an exemplary method for fabricating the circuit-incorporating light receiving device 1000. The fabrication method of the circuit-incorporating light receiving device 1000 will be described below.

Figure 2A:
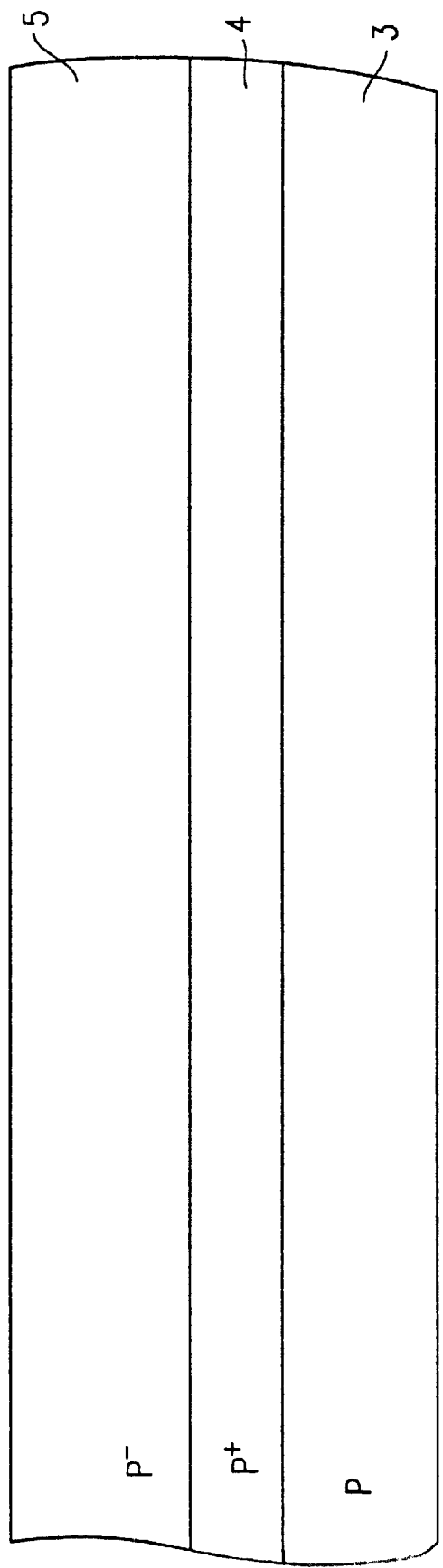
FIGS. 2A, 2B, 2C, 2D and 2E are cross-sectional views showing an exemplary method for fabricating the circuit-incorporating light receiving device of FIG. 1.

Referring to FIG. 2A, the P-type high-concentration buried layer (P$^+$) having a peak impurity concentration of $1 \times 10^{18}$ cm$^{-3}$ or more is formed, by a burying diffusion method or an epitaxial growth method, on the P-type silicon substrate 3 (P) having a specific resistance of about 40 $\Omega$cm. The first P-type epitaxial layer 5 (P$^-$) having a thickness of about 15 $\mu$m is grown on the P-type high-concentration buried layer 4 so that the layer 5 has a specific resistance of about 200 $\Omega$cm at a surface thereof (the corresponding concentration is about $1 \times 10^{14}$ cm$^{-3}$ or more). The reason the specific resistance is set to such a value is that a typical concentration of auto dope due to boron which is likely to occur is about $1 \times 10^{14}$ cm$^{-3}$ or less and a deterioration in the response characteristic due to the auto dope can be avoided when the concentration is about $1 \times 10^{14}$ cm$^{-3}$ or more.

Figure 2B:
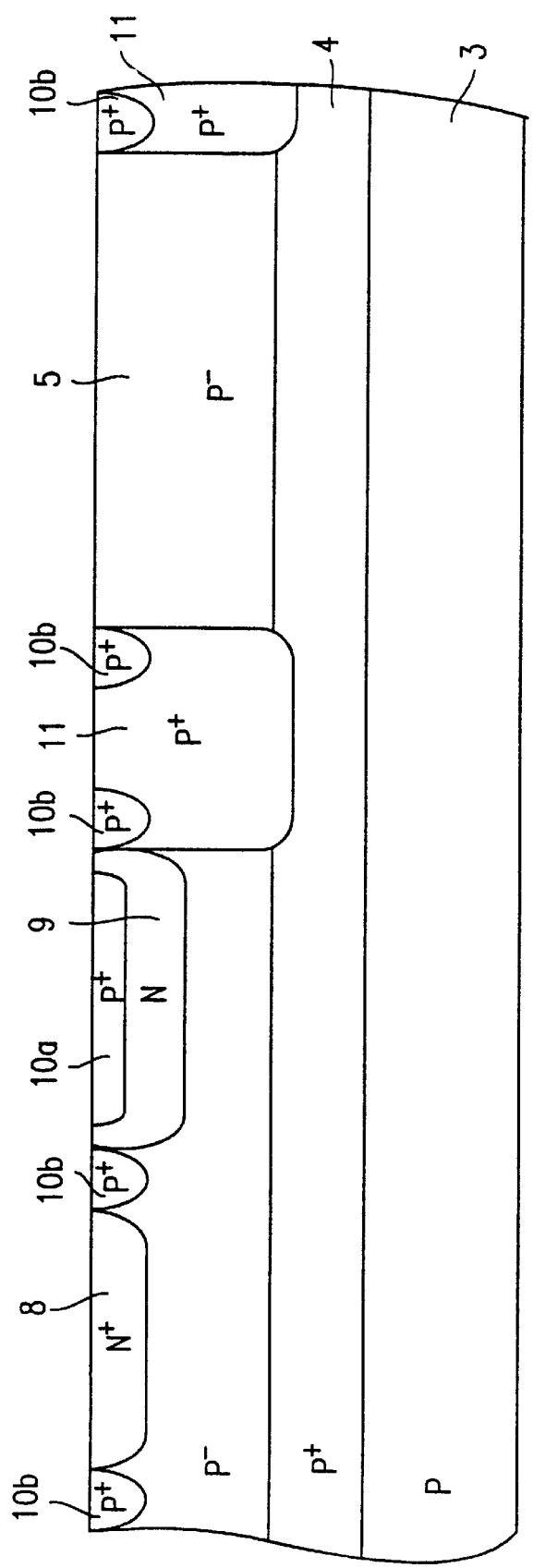

Referring to FIG. 2B, on the surface of the first P-type epitaxial layer 5, an N-type buried region 8 (N$^+$) for the NPN transistor, a first N-type well region 9 (N) for isolation of the vertical PNP transistor, a P-type buried layer 10a (P⁺) for the collector of the vertical PNP transistor and a P-type buried region 10b (P⁺) for isolation region between each element, and a P-type diffusion region 11 (P⁺) for reduction of an anode resistance which is provided deeper than the P-type buried region 10b (P⁺) and which expands from the surface of the first P-type epitaxial layer 5 up to the P-type high-concentration buried layer 4, are formed. The provision of the P-type diffusion region 11 allows the value of the anode resistance to be reduced to a fraction of a conventional value, thereby improving the response speed of the photodiode.

Figure 2C:
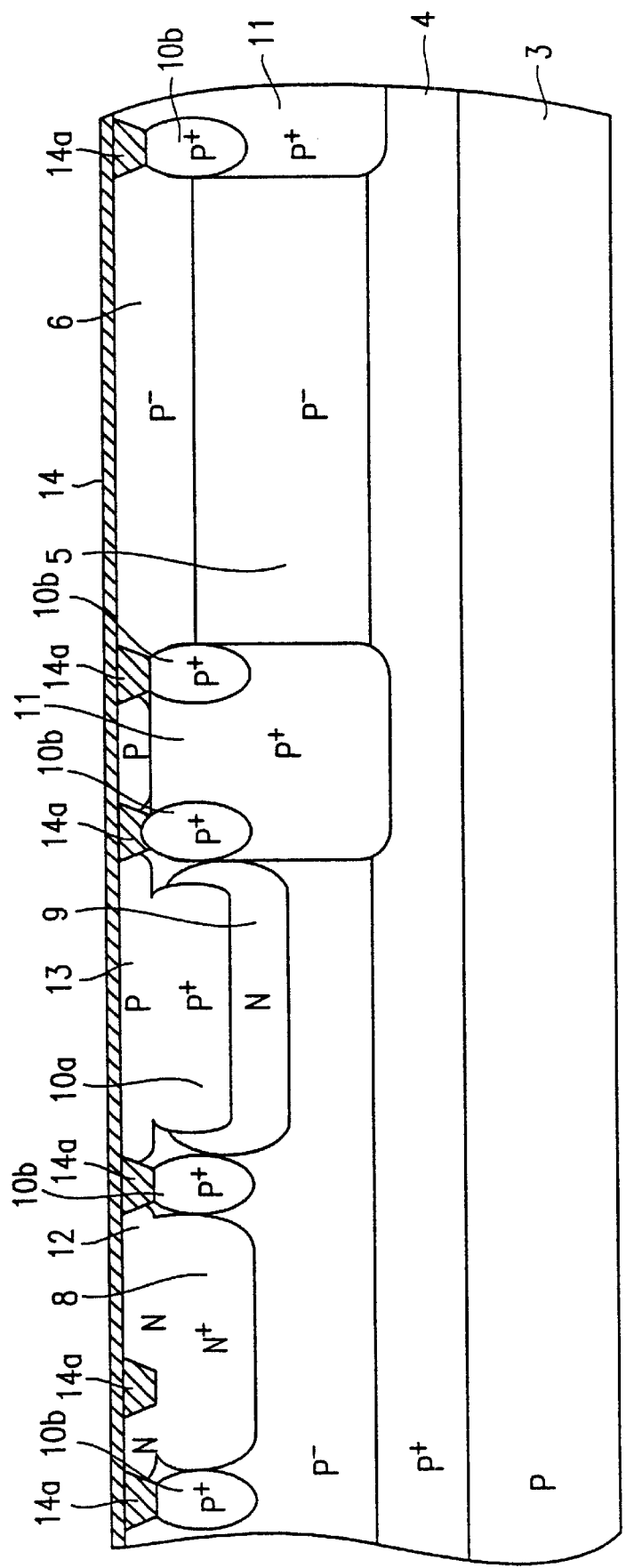

Referring to FIG. 2C, the second P-type epitaxial layer 6 (P⁻) having a specific resistance of about 200 Ωm (the corresponding concentration is about $1 \times 10^{14}$ cm⁻³ or more) and a thickness of about 2 μm is formed on the first P-type epitaxial layer 5. A second N-type well region 12 is formed in the NPN transistor region of the second P-type epitaxial layer 6 whereas a P-type well region 13 is formed in the vertical PNP transistor region. Thereafter, a LOCOS (local oxidation of silicon) step is carried out so that an isolation region 14a of an oxide film 14 (isolation oxide film) is formed. Note that in FIG. 2C, the entire hatched portion represents the oxide film 14.

As described above, a peripheral circuit element, such as a transistor, is provided using a well region structure without a conventional N-type epitaxial layer. Therefore, characteristics of the NPN transistor and the PNP transistor can be controlled irrespective of the epitaxial layers, whereby the P-type epitaxial layers 5 and 6 suitable for the photodiode can be used.

Figure 2D:
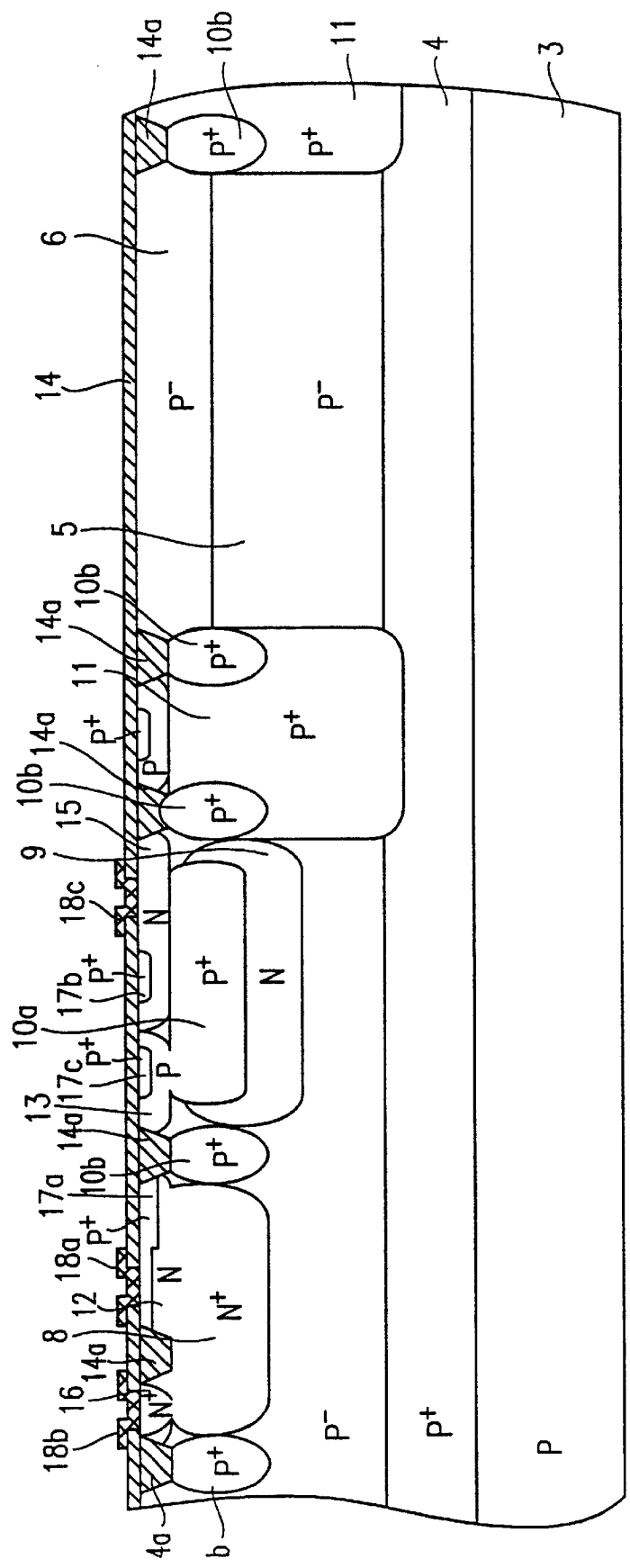

Referring to FIG. 2D, a second N-type diffusion region 15 (N) to be the base region of the vertical PNP transistor is formed in the P-type well region 13. In the second N-type well region 12, a third N-type diffusion region 16 (N⁺) for collector compensation diffusion of the NPN transistor is formed. Thereafter, P-type diffusion regions 17a, 17b and 17c (P⁺) to be the base region of the NPN transistor, the emitter region of the vertical PNP transistor, and the collector contact region of the vertical PNP transistor, respectively, are formed in the second N-type well region 12, the first N-type diffusion region 15, and the P-type well region 13, respectively. Further, polysilicon regions 18a, 18b and 18c to be the emitter region of the NPN transistor, the collector contact region of the NPN transistor, and the base contact region of the vertical PNP transistor, respectively, are formed on respective surfaces of the P-type diffusion region 17a which is the base region of the NPN transistor, the third N-type diffusion region 16, and the first N-type diffusion region 15.

Figure 2E:
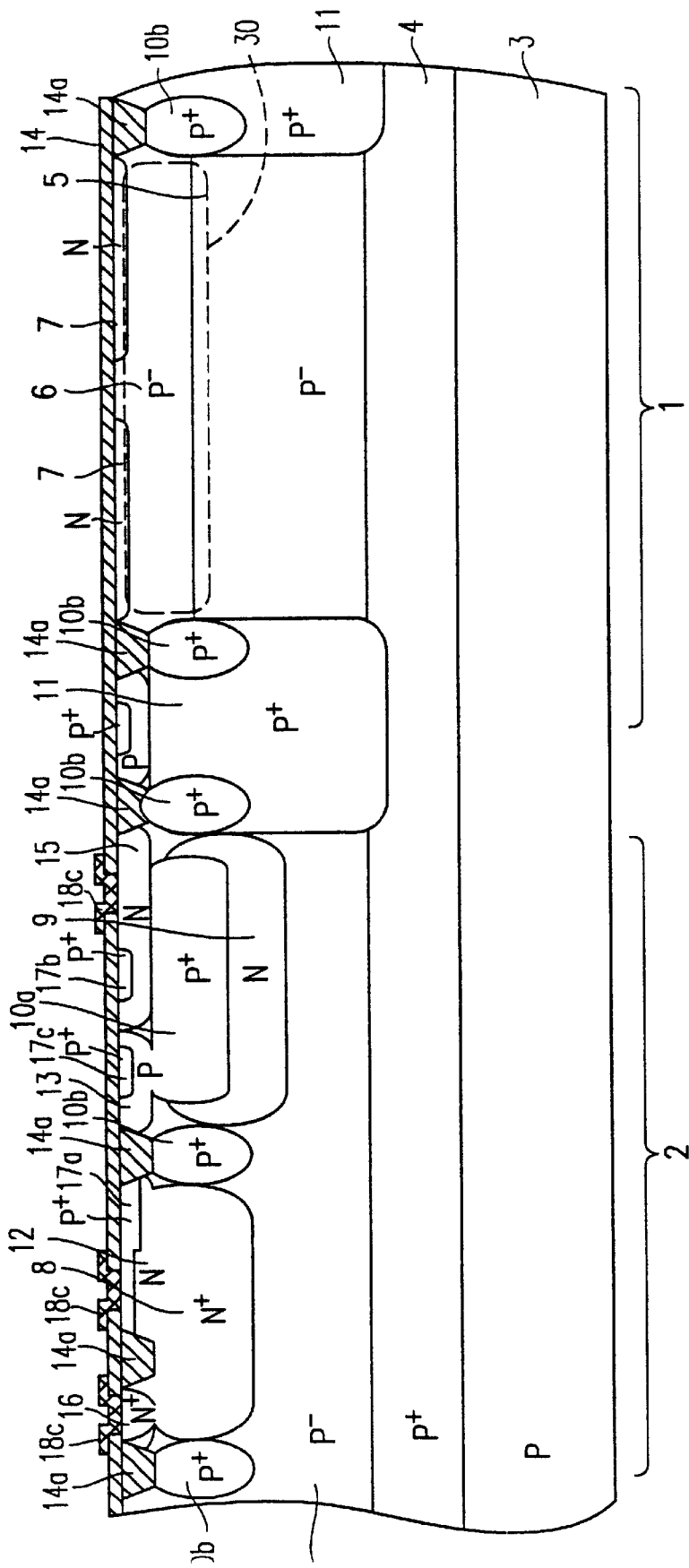

Referring to FIG. 2E, a plurality of first N-type diffusion regions 7 of arsenic to be cathodes are formed on a surface of the second P-type epitaxial layer 6 in the photodiode region 1. The photodiode region 1 is activated using a ramp anneal apparatus or the like. In this manner, a considerably shallow PN junction can be provided. In this case, the depth of the PN junction can be about 0.3 μm or less. Therefore, even when signal light is short-wavelength light as small as about 410 nm, reverse bias applied to the photodiode region 1 in signal light detection causes most of carriers to occur in the depletion layer 30 (FIG. 1) expanding from the interface (PN junction) between the second P-type epitaxial layer 6 and the first N-type diffusion region 7. A high level of sensitivity can be achieved. Alternatively, the first N-type diffusion region 7 may include another N-type impurity, such as phosphorous.

The P-type high-concentration buried layer 4 and the P-type diffusion region 11 can be optionally omitted for the purpose of simplification of the fabrication steps.

Further, the light detection photodiode portion may be divided by isolation regions using LOCOS (i.e., the groove 6'). Specifically, a single N-type diffusion region is initially formed and then divided by isolation regions using LOCOS.

EXAMPLE 2

Figure 3B:
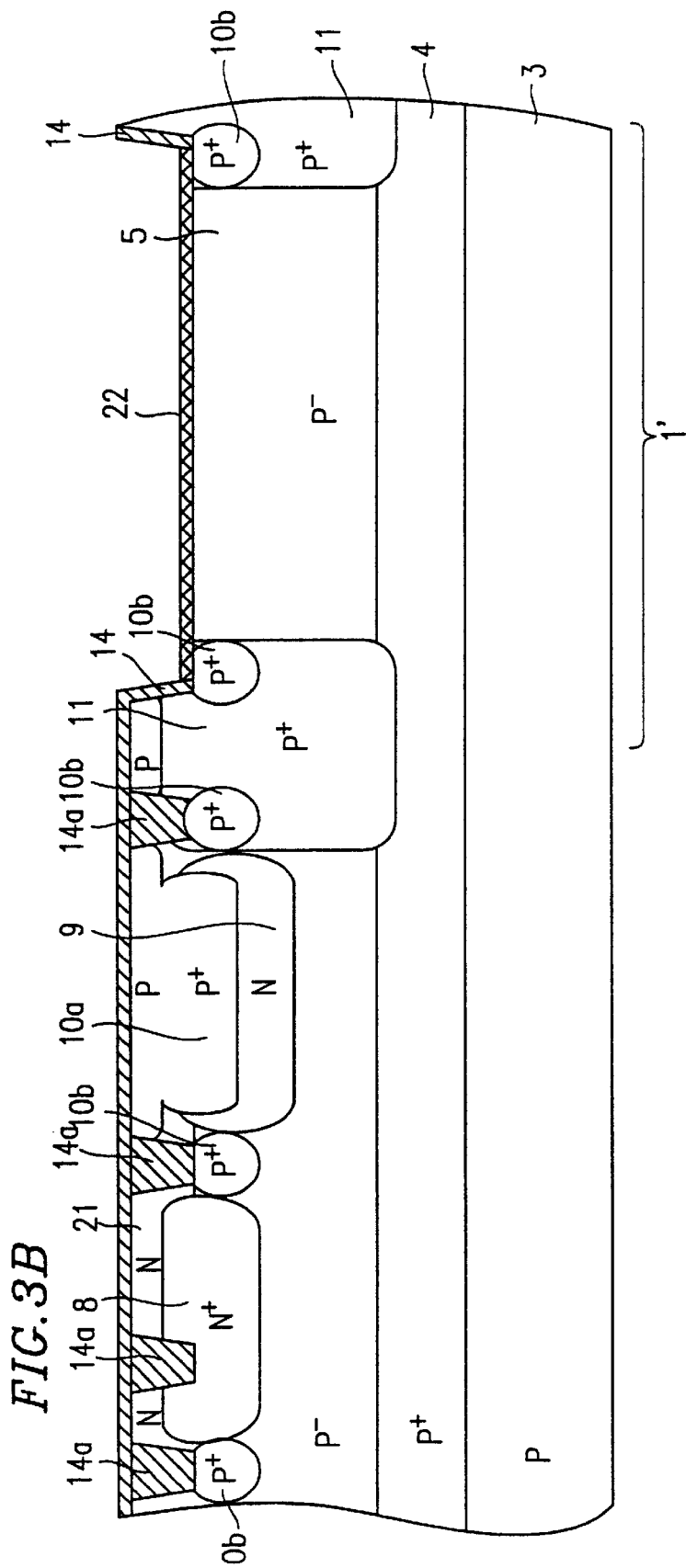
Figure 3C:
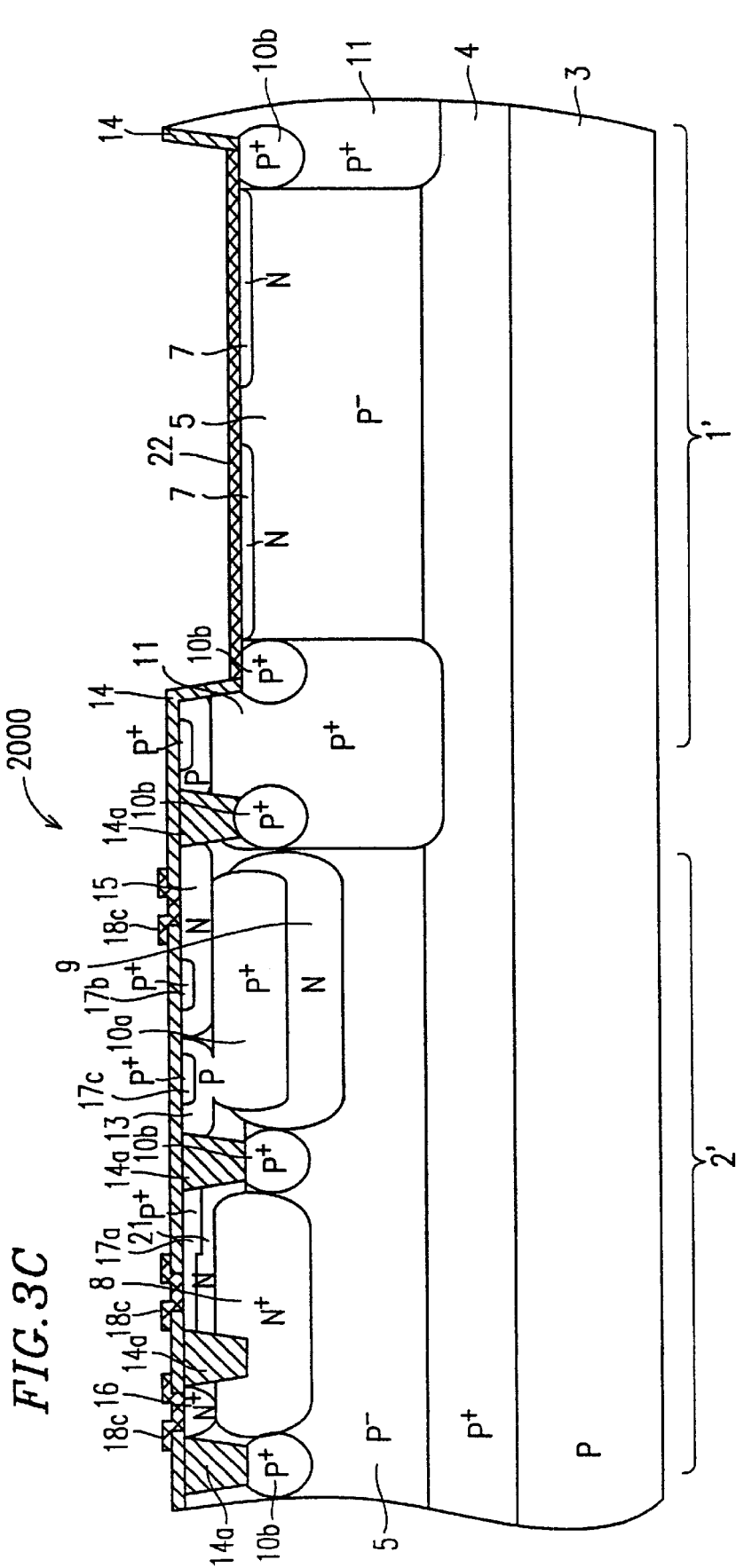

FIGS. 3A, 3B and 3C are cross-sectional views showing an exemplary method for fabricating a circuit-incorporating light receiving device 2000 according to Example 2 of the present invention. The method of the circuit-incorporating light receiving device 2000 will be described in only points which differ from the structure and fabrication method of the circuit-incorporating light receiving device 1000 of Example 1.

Initially, a structure of the circuit-incorporating light receiving device 2000 will be described. Referring to FIG. 3C, in a photodiode region 1', a P-type silicon substrate 3 (P), a P-type high-concentration buried layer 4 (P⁺) and a first P-type epitaxial layer 5 (P⁻) (the concentration of the layer 5 is about $1 \times 10^{14}$ cm⁻³ or more) are successively provided in this order. A first N-type diffusion region 7 (N) is buried in a surface of the first P-type epitaxial layer 5. The first P-type epitaxial layer 5 and the first N-type diffusion region 7, which have PN junction, form a light detection photodiode portion for detecting signal light.

Further, in a peripheral circuit region 2', a P-type silicon substrate 3 (P), a P-type high-concentration buried layer 4 (P⁺), a first P-type epitaxial layer 5 (P⁻), and an N-type epitaxial layer 21 (N) are provided. An NPN transistor and a vertical PNP transistor as described in Example 1 are provided in the first P-type epitaxial layer 5 and the N-type epitaxial layer 21.

A difference to Example 1 is that the N-type epitaxial layer 21 in the peripheral circuit region 2' of Example 2 is used instead of the second P-type epitaxial layer 6 in the peripheral circuit region 2 of Example 1. Further, the N-type epitaxial layer 21 is provided on the peripheral circuit region 2' without covering the light detection photodiode portion. Still further, the first N-type diffusion region 7 is provided within the first P-type epitaxial layer 5. Furthermore, the first well region 12 (FIG. 2C) is not required.

Next, the fabrication method will be described. Steps shown in FIGS. 2A and 2B are the same as those for the circuit-incorporating light receiving device 1000 of Example 1. A difference to Example 1 is that since the N-type epitaxial layer 21 in the photodiode region 1' is removed later, the conductivity type (P-type or N-type) and specific resistance (concentration) thereof may be optimized so as to match a characteristic of a transistor to be provided in the N-type epitaxial layer 21. For example, the N-type epitaxial layer 21 may have a conductivity of N-type and a specific resistance of about 3 Ωm. This means the possibility that the fabrication steps of Example 2 are carried out under conditions similar to the conventional fabrication steps.

Referring to FIG. 3A, a P-type buried region 10b serving as an isolation region and the photodiode region 1' are subjected to Si etching, and thereafter a LOCOS step is carried out to form an oxide film 14.

Referring to FIG. 3B, only the oxide film 14 in the photodiode region 1' is removed so as to form a groove which exposes the first P-type epitaxial layer 5. An antireflection film 22 is formed on a surface of the first P-type epitaxial layer 5 which is exposed at a bottom side of the groove. In this manner, the photodiode region 1 is formed using the LOCOS step in conjunction with the Si etching in addition of trench. This is because that if only the Si etching is used, damage occurs in a semiconductor surface due to the dry etching. In such a case, the occurrence of recombination of carriers increases in the vicinity of the surface, resulting in a reduction in the photosensitivity of a photodiode. Such an adverse effect can be avoided by oxidizing a surface to be etched with LOCOS and removing the oxide film, thereby preventing deterioration due to the effect.

Referring to FIG. 3C, after a transistor has been formed in the peripheral circuit region 2' in a manner similar to the fabrication method of Example 1, a first N-type diffusion region 7 to be a cathode within a surface of the first P-type epitaxial layer 5 in the photodiode region 1' is formed by arsenic ion implantation. The photodiode region 1' is activated using a ramp anneal apparatus or the like. Alternatively, the first N-type diffusion region 7 may be formed by doping another N-type impurity, such as phosphorous.

Similar to Example 1, the P-type high-concentration buried layer 4 and the P-type diffusion region 11 can be optionally omitted.

An advantageous point of the circuit-incorporating light receiving device 2000 of Example 2 is that the specific resistance of the N-type epitaxial layer 21 may not necessarily be large (i.e., the concentration may not necessarily be low) since a second semiconductor layer, i.e., the N-type epitaxial layer 21, is not provided in the photodiode region 1'. It is difficult to control a thin, low-concentration epitaxial layer, and the specific resistance thereof is limited to about 100 Ωcm due to auto dope caused by boron for isolation of elements. It is thus difficult to manufacture a thin, low-concentration epitaxial layer having a specific resistance of about 100 Ωcm. In contrast, in Example 2, the thick first P-type epitaxial layer 5 can be used, whereby the layer 5 may have a specific resistance as large as about 500 Ωcm. This can lead to an improvement in a frequency characteristic of a photodiode. Similar to Example 1, the N-type diffusion region 7 may be divided by the groove 6' (FIG. 1B).

EXAMPLE 3

Figure 4B:
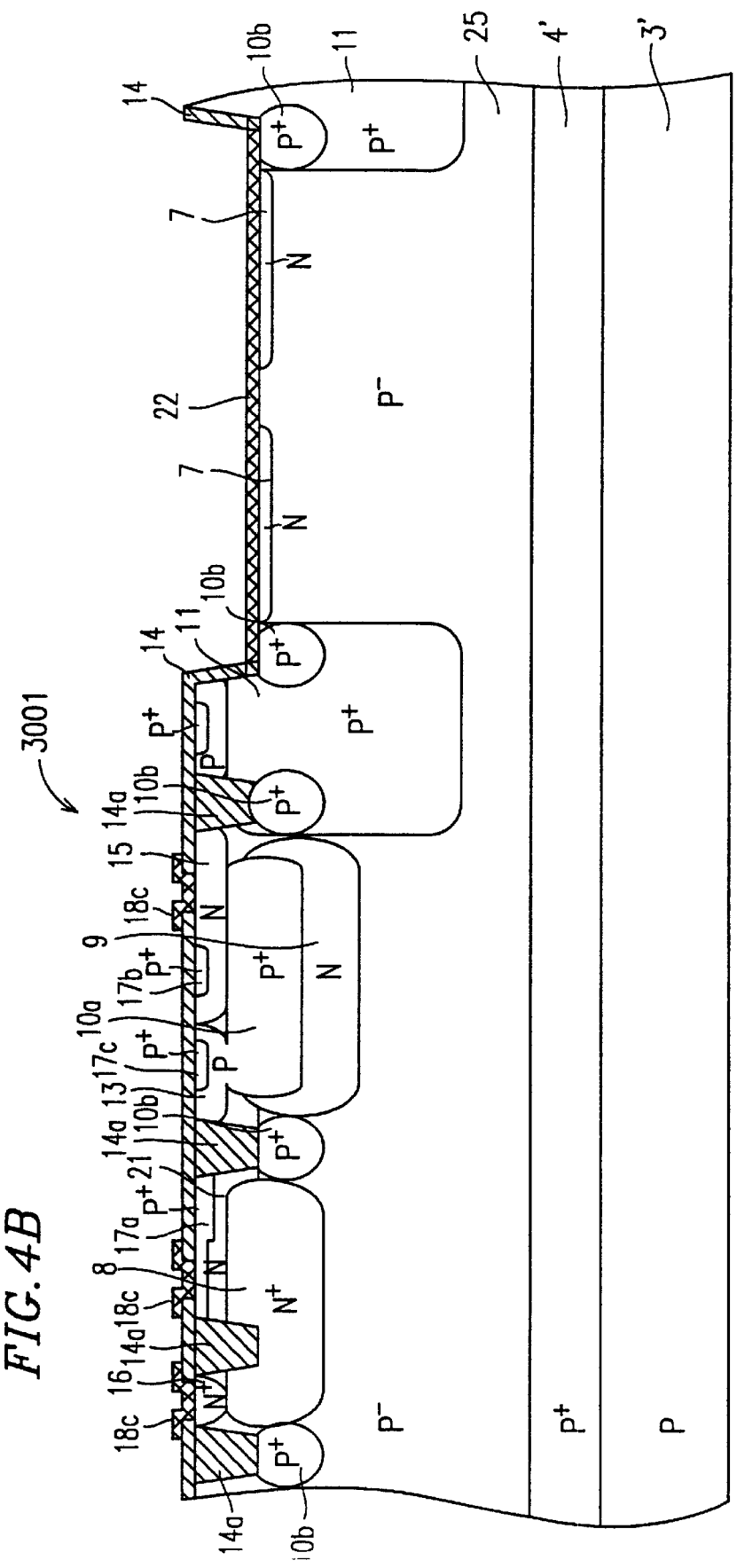
Figure 4C:
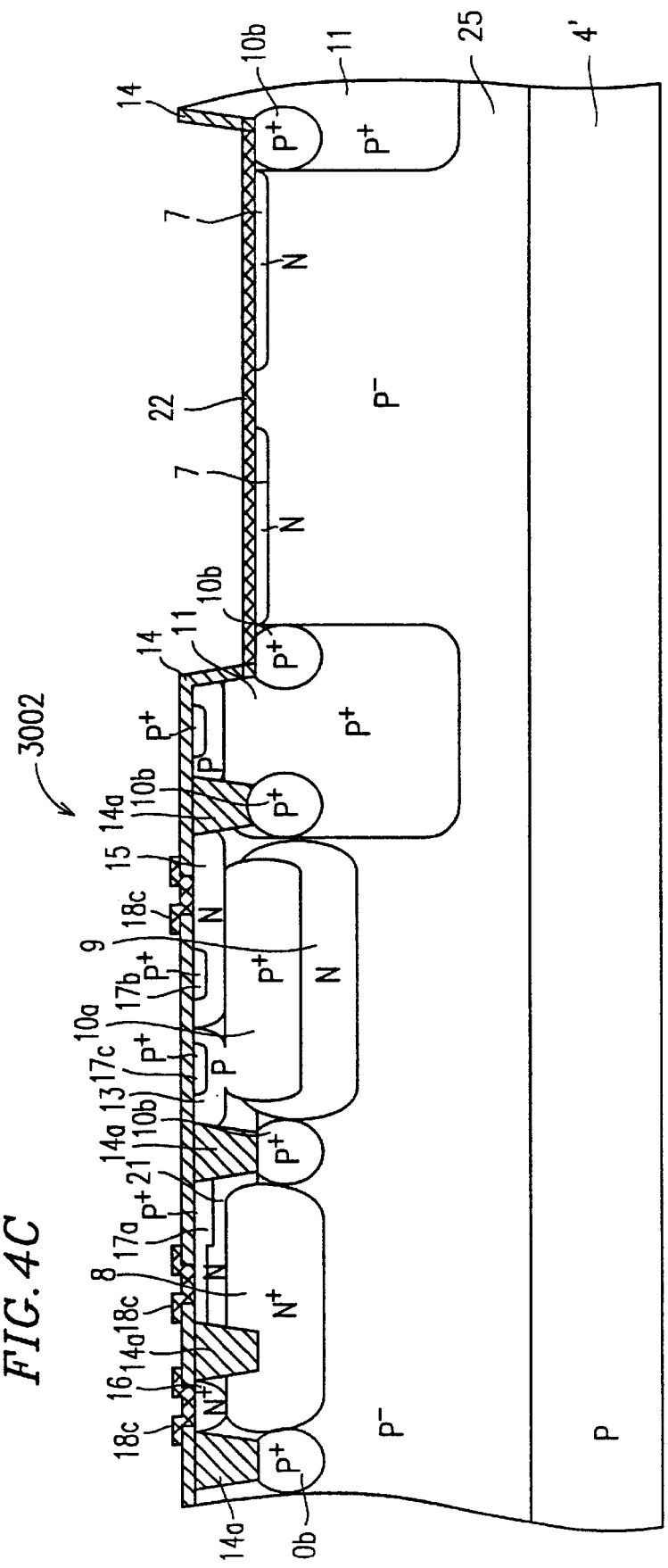
Figure 5:
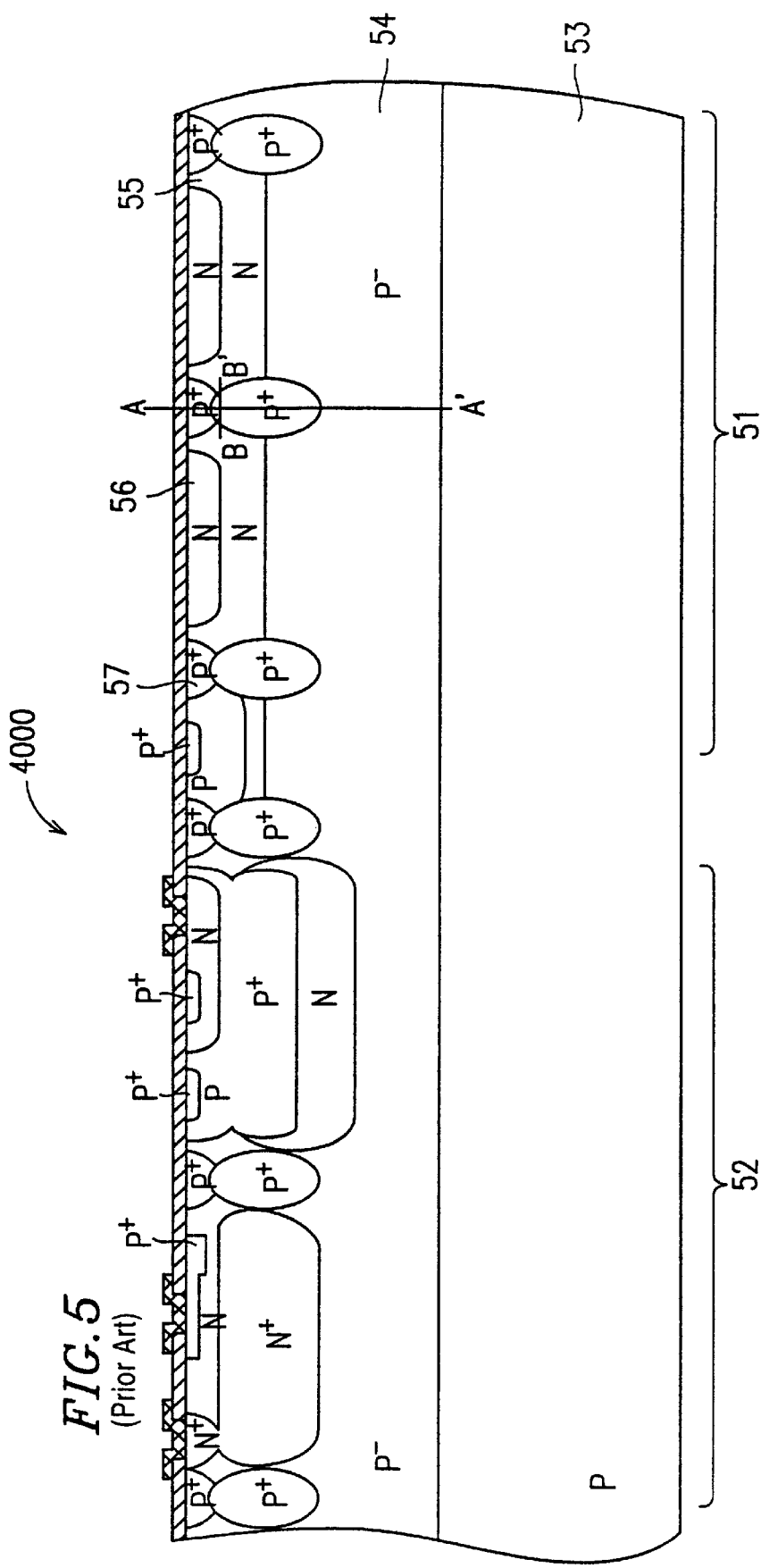
FIG. 5 is a cross-sectional view showing a structure of a conventional circuit-incorporating light receiving device.
Figure 6A:
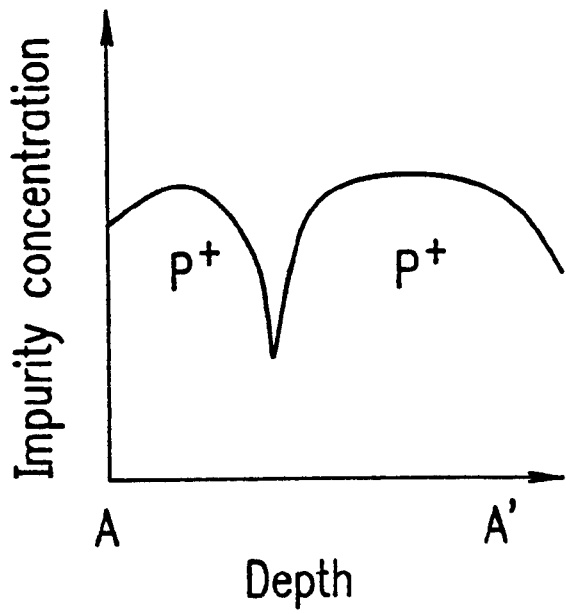
FIGS. 6A and 6B are diagrams showing concentration distribution graphs of a split portion in the circuit-incorporating light receiving device of FIG. 5 in certain directions.
Figure 6B:
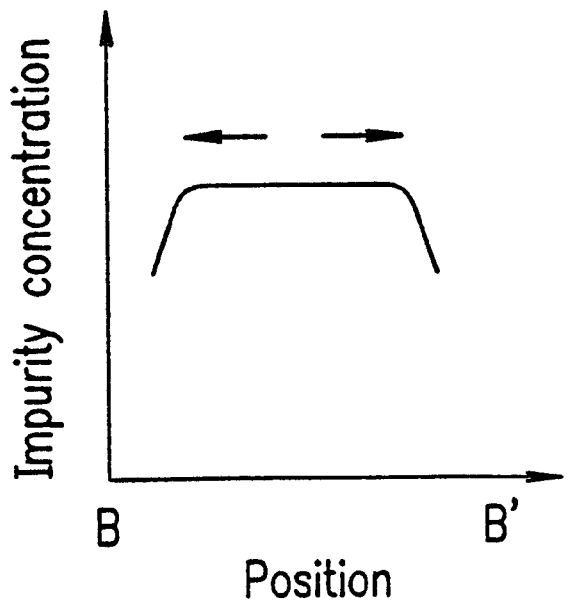

FIGS. 4A, 4B and 4C are cross-sectional views showing a circuit-incorporating light receiving device 3000 according to Example 3 of the present invention. The circuit-incorporating light receiving device 3000 will be described in only points which differ from the circuit-incorporating light receiving device 2000 of Example 2.

In the circuit-incorporating light receiving device 3000 of Example 3, a P-type semiconductor substrate 25 (P⁻) which has been formed in advance is used instead of the first P-type epitaxial layer 5 (FIG. 3C). This is because it is relatively easy to cause the substrate to have a specific resistance of about 1000 Ωcm or more which is greater than a high specific resistance attained by an epitaxial layer. Such a structure has an advantage of further reducing a junction capacitance.

Further, the P-type silicon substrate 3 and the P-type high-concentration buried layer 4 (FIG. 3C) are not provided under the P-type substrate 25. Therefore, the P-type diffusion region 11 does not reach a bottom side of the P-type substrate 25, and the diffusion stops at a position deeper than the P-type buried region 10b. Except for this point, the circuit-incorporating light receiving device 3000 of Example 3 is the same as that of Example 2.

In Example 3, as shown in FIG. 4B, a layer 4' (P⁺) having a low specific resistance of about 4 Ωcm and a wafer 3' (P) having a specific resistance of about 1000 Ωcm or more are attached under the P-type semiconductor substrate 25 in this order. Alternatively, the wafer 3' having the specific resistance of about 1000 Ωcm or more which includes the layer 4' having the low specific resistance of about 4 Ωcm as a high-concentration buried layer is attached to the P-type semiconductor substrate 25. In these cases, a substantially ideal photodiode having a small capacitance and resistance can be achieved. Further, as shown in FIG. 4C, only the high-concentration buried layer 4' may be attached to a lower side of the P-type semiconductor substrate 25. Similar to Example 1, the N-type diffusion region 7 may be divided by the groove 6' (FIG. 1B).

Note that in Examples 1 through 3, formation of an electrode contact of the photodiode and conductors in the entire chip is omitted for the sake of simplicity.

As described above, according to the present invention, a circuit-incorporating light receiving device, in which a light detection photodiode having high photosensitivity and response characteristic over a wide range from long wavelength to short wavelength and a circuit element can be easily formed on the same substrate and which has low cost and high performance, can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A circuit-incorporating light receiving device, comprising:
    a first semiconductor substrate of a first conductivity type;
    a first semiconductor layer of the first conductivity type;
    a second semiconductor layer of the first conductivity type;
    a diffusion region of the second conductivity type, provided in a first portion of the second semiconductor layer of the first conductivity type;
    a circuit element provided in the first portion of the first semiconductor layer of the first conductivity type and a second portion of the second semiconductor layer of the first conductivity type,
    wherein:
        the second semiconductor layer of the first conductivity type and the diffusion region of the second conductivity type form a light detection photodiode portion;
        the diffusion region of the second conductivity type has a diffusion depth less than or equal to a penetration depth of short-wavelength signal light; and
        wherein the first and second semiconductor layers are doped with impurity concentration(s) so that a resulting depletion layer caused by reverse bias extends into the first and second semiconductor layers at least to a penetration depth of light having a wavelength of 780 nm, and wherein the surface impurity concentration of the first semiconductor layer of the first conductivity type is greater than or equal to $1 \times 10^{14}$ cm$^{-3}$.

2. A circuit-incorporating light receiving device according to claim 1, wherein the diffusion depth of the diffusion region of the second conductivity type is less than or equal to 0.3 μm.

3. A circuit-incorporating light receiving device according to claim 2, wherein the short-wavelength signal light is blue light.

4. A circuit-incorporating light receiving device, comprising:

a first semiconductor substrate of a first conductivity type;

a first semiconductor layer of the first conductivity type;

a second semiconductor layer of the first conductivity type;

a diffusion region of the second conductivity type, provided in a first portion of the second semiconductor layer of the first conductivity type;

a circuit element provided in the first portion of the first semiconductor layer of the first conductivity type and a second portion of the second semiconductor layer of the first conductivity type, wherein:
   the second semiconductor layer of the first conductivity type and the diffusion region of the second conductivity type form a light detection photodiode portion;
   the diffusion region of the second conductivity type has a diffusion depth less than or equal to a penetration depth of short-wavelength signal light; and
   wherein a surface impurity concentration of the first semiconductor layer of the first conductivity type is greater than or equal to $1 \times 10^{14}$ cm$^{-3}$.

5. A circuit-incorporating light receiving device according to claim 1, wherein the first semiconductor layer of the first conductivity type and the second semiconductor layer of the first conductivity type have impurity concentrations such that when reverse bias is applied to the light detection photodiode portion upon detection of the signal light, a depletion layer expanding from an interface between the second semiconductor layer of the first conductivity type and the diffusion region of the second conductivity type toward the second semiconductor layer of the first conductivity type side, reaches a position deeper than an interface between the first semiconductor layer of the first conductivity type and the second semiconductor layer of the first conductivity type.

6. A circuit-incorporating light receiving device, comprising:

a first semiconductor substrate of a first conductivity type;

a first semiconductor layer of the first conductivity type;

a second semiconductor layer of the first conductivity type;

a diffusion region of the second conductivity type, provided in a first portion of the second semiconductor layer of the first conductivity type;

a circuit element provided in the first portion of the first semiconductor layer of the first conductivity type and a second portion of the second semiconductor layer of the first conductivity type, wherein:
   the second semiconductor layer of the first conductivity type and the diffusion region of the second conductivity type form a light detection photodiode portion;
   the diffusion region of the second conductivity type has a diffusion depth less than or equal to a penetration depth of short-wavelength signal light; and
   wherein a high concentration buried layer of the first conductivity type is provided between the first semiconductor substrate of the first conductivity type and the first semiconductor layer of the first conductivity type, wherein an impurity concentration of the high-concentration buried layer is greater than an impurity concentration of the first semiconductor layer of the first conductivity type.

7. A circuit-incorporating light receiving device according to claim 6, wherein the high-concentration buried layer of the first conductivity type is provided by a buried diffusion method or an epitaxial growth method.

8. A circuit-incorporating light receiving device according to claim 1, wherein:
   the first portion of the first semiconductor layer of the first conductivity type and the second portion of the second semiconductor layer of the first conductivity type have an N-type well region and a P-type well region; and
   the circuit element is provided using the N-type well region and the P-type well region.

9. A circuit-incorporating light receiving device according to claim 1, wherein an isolation diffusion region of the first conductivity type is provided between the light detection photodiode portion and the circuit element, wherein an impurity concentration of the isolation diffusion region is greater than an impurity concentration of the first semiconductor layer of the first conductivity type, and the isolation diffusion region of the first conductivity type reaches a position deeper than the light detection photodiode portion and the circuit element.

10. A circuit-incorporating light receiving device, comprising:

a first semiconductor substrate of a first conductivity type;

a first semiconductor layer of the first conductivity type;

a second semiconductor layer of the first conductivity type;

a diffusion region of the second conductivity type, provided in a first portion of the second semiconductor layer of the first conductivity type;

a circuit element provided in the first portion of the first semiconductor layer of the first conductivity type and a second portion of the second semiconductor layer of the first conductivity type, wherein:
   the second semiconductor layer of the first conductivity type and the diffusion region of the second conductivity type form a light detection photodiode portion;
   the diffusion region of the second conductivity type has a diffusion depth less than or equal to a penetration depth of short-wavelength signal light; and
   wherein an impurity concentration of each of the first semiconductor layer of the first conductivity type and the second semiconductor layer of the first conductivity type is greater than or equal to $1 \times 10^{14}$ cm$^{-3}$.

11. A circuit-incorporating light receiving device, comprising:

a first semiconductor substrate of a first conductivity type;

a first semiconductor layer of the first conductivity type;

a second semiconductor layer of the first conductivity type;

a diffusion region of the second conductivity type, provided in a first portion of the second semiconductor layer of the first conductivity type;

a circuit element provided in the first portion of the first semiconductor layer of the first conductivity type and a second portion of the second semiconductor layer of the first conductivity type, wherein:
   the second semiconductor layer of the first conductivity type and the diffusion region of the second conductivity type form a light detection photodiode portion;
   the diffusion region of the second conductivity type has a diffusion depth less than or equal to a penetration depth of short-wavelength signal light; and wherein the diffusion region of the second conductivity type is divided into a plurality of regions by the second semiconductor layer of the first conductivity type.

12. A circuit-incorporating light receiving device, comprising:

a first semiconductor substrate of a first conductivity type;

a first semiconductor layer of the first conductivity type;

a second semiconductor layer of the first conductivity type;

a diffusion region of the second conductivity type, provided in a first portion of the second semiconductor layer of the first conductivity type;

a circuit element provided in the first portion of the first semiconductor layer of the first conductivity type and a second portion of the second semiconductor layer of the first conductivity type, wherein:
the second semiconductor layer of the first conductivity type and the diffusion region of the second conductivity type form a light detection photodiode portion;
the diffusion region of the second conductivity type has a diffusion depth less than or equal to a penetration depth of short-wavelength signal light; and
wherein the diffusion region of the second conductivity type is divided into a plurality of regions by a groove.

13. A circuit-incorporating light receiving device according to claim 12, wherein the groove is provided by a LOCOS method.

14. A circuit-incorporating light receiving device, comprising:

a first semiconductor substrate of a first conductivity type;

a first semiconductor layer of the first conductivity type;

a second semiconductor layer of the first conductivity type, a first groove reaching the first semiconductor layer of the first conductivity type being provided in the second semiconductor layer;

a diffusion region of a second conductivity type provided in a first portion of the first semiconductor layer of the first conductivity type, the first portion being exposed at a bottom side of the first groove; and a circuit element provided in a second portion of the first semiconductor layer of the first conductivity type and a first portion of the second semiconductor layer of the first conductivity type, wherein:
the first semiconductor layer of the first conductivity type and the diffusion region of the second conductivity type form a light detection photodiode portion; and
the diffusion region of the second conductivity type has a diffusion depth less than or equal to a penetration depth of short-wavelength signal light.

15. A circuit-incorporating light receiving device according to claim 14, wherein the diffusion depth of the diffusion region of the second conductivity type is less than or equal to 0.3 µm.

16. A circuit-incorporating light receiving device according to claim 15, wherein the short-wavelength signal light is blue light.

17. A circuit-incorporating light receiving device according to claim 14, wherein a high-concentration buried layer of the first conductivity type is provided between the first semiconductor substrate of the first conductivity type and the first semiconductor layer of the first conductivity type, wherein an impurity concentration of the high-concentration buried layer is greater than an impurity concentration of the first semiconductor layer of the first conductivity type.

18. A circuit-incorporating light receiving device according to claim 17, wherein a high-concentration buried layer of the first conductivity type is provided by a buried diffusion method or an epitaxial growth method.

19. A circuit-incorporating light receiving device according to claim 14, wherein:

the second portion of the first semiconductor layer of the first conductivity type and the first portion of the second semiconductor layer of the first conductivity type have an N-type well region and a P-type well region; and the circuit element is provided using the N-type well region and the P-type well region.

20. A circuit-incorporating light receiving device according to claim 14, wherein an isolation diffusion region of the first conductivity type is provided between the light detection photodiode portion and the circuit element, wherein an impurity concentration of the isolation diffusion region is greater than an impurity concentration of the first semiconductor layer of the first conductivity type, and the isolation diffusion region reaches a position deeper than the light detection photodiode portion and the circuit element.

21. A circuit-incorporating light receiving device according to claim 14, wherein an impurity concentration of the first semiconductor layer of the first conductivity type is greater than or equal to $1 \times 10^{14}$ cm$^{-3}$.

22. A circuit-incorporating light receiving device according to claim 14, wherein the diffusion region of the second conductivity type is divided into a plurality of regions by the first semiconductor layer of the first conductivity type.

23. A circuit-incorporating light receiving device according to claim 14, wherein the diffusion region of the second conductivity type is divided into a plurality of regions by a second groove.

24. A circuit-incorporating light receiving device according to claim 14, wherein the first groove is provided by a LOCOS method.

25. A circuit-incorporating light receiving device, comprising:

a first semiconductor substrate of a first conductivity type;

a first semiconductor layer of the first conductivity type, a first groove reaching the first semiconductor substrate of the first conductivity type being provided in the first semiconductor layer;

a diffusion region of a second conductivity type, provided in a first portion of the first semiconductor substrate of the first conductivity type, the first portion being exposed at a bottom side of the first groove; and a circuit element provided in a second portion of the first semiconductor substrate of the first conductivity type and the first portion of the first semiconductor layer of the first conductivity type, wherein:
the first semiconductor substrate of the first conductivity type and the diffusion region of the second conductivity type form a light detection photodiode portion; and
the diffusion region of the second conductivity type has a diffusion depth less than or equal to a penetration depth of short-wavelength signal light.

26. A circuit-incorporating light receiving device according to claim 25, wherein the diffusion depth of the diffusion region of the second conductivity type is less than or equal to 0.3 µm.

27. A circuit-incorporating light receiving device according to claim 26, wherein the short-wavelength signal light is blue light.

28. A circuit-incorporating light receiving device according to claim 25, wherein a second semiconductor substrate of the first conductivity type is provided at the bottom side of the first semiconductor substrate of the first conductivity type, wherein a high-concentration buried layer of the first conductivity type having an impurity concentration greater than an impurity concentration of the first semiconductor substrate of the first conductivity type is provided in the second semiconductor substrate of the first conductivity type.

29. A circuit-incorporating light receiving device according to claim 25, wherein a second semiconductor substrate of the first conductivity type is provided at the bottom side of the first semiconductor substrate of the first conductivity type, wherein the second semiconductor substrate of the first conductivity type having an impurity concentration greater than an impurity concentration of the first semiconductor substrate of the first conductivity type.

30. A circuit-incorporating light receiving device according to claim 25, wherein:
the second portion of the first semiconductor substrate of the first conductivity type and the first portion of the first semiconductor layer of the first conductivity type have an N-type well region and a P-type well region; and the circuit element is provided using the N-type well region and the P-type well region.

31. A circuit-incorporating light receiving device according to claim 25, wherein an isolation diffusion region of the first conductivity type is provided between the light detection photodiode portion and the circuit element, wherein an impurity concentration of the isolation diffusion region is greater than an impurity concentration of the first semiconductor substrate of the first conductivity type, and the isolation diffusion region reaches a position deeper than the light detection photodiode portion and the circuit element.

32. A circuit-incorporating light receiving device according to claim 25, wherein an impurity concentration of the first semiconductor substrate of the first conductivity type is greater than or equal to $1 \times 10^{14}$ cm$^{-3}$.

33. A circuit-incorporating light receiving device according to claim 25, wherein the diffusion region of the second conductivity type is divided into a plurality of regions by the first semiconductor substrate of the first conductivity type.

34. A circuit-incorporating light receiving device according to claim 25, wherein the diffusion region of the second conductivity type is divided into a plurality of regions by a second groove.

35. A circuit-incorporating light receiving device according to claim 25, wherein the first groove is provided by a LOCOS method.

* * * * *